US007257803B1

(12) United States Patent
Wilton et al.

(10) Patent No.: US 7,257,803 B1
(45) Date of Patent: Aug. 14, 2007

(54) METHOD FOR CONSTRUCTING AN INTEGRATED CIRCUIT DEVICE HAVING FIXED AND PROGRAMMABLE LOGIC PORTIONS AND PROGRAMMABLE LOGIC ARCHITECTURE FOR USE THEREWITH

(75) Inventors: Steven J E Wilton, Vancouver (CA); Kimberly Bozman, Toronto (CA); Noha Kafafi, North Vancouver (CA); James Wu, Vancouver (CA)

(73) Assignee: Altera Corporation, San Jose, CA (US)

( * ) Notice: Subject to any disclaimer, the term of this patent is extended or adjusted under 35 U.S.C. 154(b) by 36 days.

(21) Appl. No.: 11/224,156

(22) Filed: Sep. 12, 2005

Related U.S. Application Data

(62) Division of application No. 10/649,401, filed on Aug. 26, 2003, now Pat. No. 6,983,442.

(60) Provisional application No. 60/405,735, filed on Aug. 26, 2002.

(51) Int. Cl.
*G06F 17/50* (2006.01)
(52) U.S. Cl. .......................................... 716/18; 716/17
(58) Field of Classification Search ................ 716/7, 716/16–18
See application file for complete search history.

(56) References Cited

U.S. PATENT DOCUMENTS

| | | | |
|---|---|---|---|
| 5,699,283 A * | 12/1997 | Okazaki et al. ................ 703/15 |
| 5,825,202 A | 10/1998 | Tavana et al. |
| 5,874,834 A | 2/1999 | New |
| 6,091,262 A | 7/2000 | New |
| 6,094,065 A | 7/2000 | Tavana et al. |
| 6,216,257 B1 * | 4/2001 | Agrawal et al. ............... 716/16 |
| 6,242,945 B1 | 6/2001 | New |
| 6,490,707 B1 | 12/2002 | Baxter |
| 6,515,509 B1 | 2/2003 | Baxter |
| 6,526,563 B1 | 2/2003 | Baxter |
| 6,744,274 B1 * | 6/2004 | Arnold et al. ................ 326/16 |
| 6,857,110 B1 * | 2/2005 | Rupp et al. .................... 716/4 |
| 6,948,105 B2 * | 9/2005 | Rajsuman ................... 714/724 |
| 6,961,919 B1 * | 11/2005 | Douglass ..................... 716/18 |

(Continued)

OTHER PUBLICATIONS

Wilton, S.J.E., et al., "Programmable Logic IP Cores in SoC Design: Opportunities and Challenges", *Proceedings of the IEEE 2001 Custom Integrated Circuits Conference*, pp. 63-66 (May 2001).

(Continued)

*Primary Examiner*—Paul Dinh
*Assistant Examiner*—Suchin Parihar
(74) *Attorney, Agent, or Firm*—Fish & Neave IP Group of Ropes & Gray LLP; Jeffrey H. Ingerman

(57) ABSTRACT

Integrated circuit devices having fixed and programmable logic portions are made by combining a hardware description language representation of the fixed logic and a hardware description language representation of the programmable logic to create a single hardware description language representation of a device. This allows multiple portions of programmable logic, distributed where needed in whatever size needed, to be interspersed among the fixed logic. Because the behavior of the programmable logic, rather than of the user programming, is being represented, a programmable logic architecture is provided that lacks behaviors, such as combinational loops, that would cause compilation of the hardware description language to generate errors.

11 Claims, 6 Drawing Sheets

U.S. PATENT DOCUMENTS

| | | | |
|---|---|---|---|
| 2004/0015341 A1* | 1/2004 | Ferris | 703/28 |
| 2004/0162805 A1* | 8/2004 | Wozniak | 707/1 |
| 2005/0010378 A1* | 1/2005 | Zeidman et al. | 703/1 |
| 2005/0084076 A1 | 4/2005 | Dhir et al. | |
| 2005/0149898 A1* | 7/2005 | Hakewill et al. | 716/18 |
| 2006/0015862 A1* | 1/2006 | Odom et al. | 717/168 |
| 2006/0195822 A1* | 8/2006 | Beardslee et al. | 717/124 |
| 2006/0259884 A1* | 11/2006 | Fong et al. | 716/5 |

OTHER PUBLICATIONS

Phillips, S., et al., "Automatic Layout of Domain-Specific Reconfigurable Subsystems for System-on-a-Chip", *Tenth ACM International Symposium on Field-Programmable Gate Arrays*, pp. 165-173 (Feb. 2002).

Ghodrat, M., et al., "The Automatic FPGA Generator", *Proceedings of the 5th Annual International Computer Society of Iran Computer Conference*, pp. 3-10 (2000).

* cited by examiner

METHOD FOR CONSTRUCTING AN INTEGRATED CIRCUIT DEVICE HAVING FIXED AND PROGRAMMABLE LOGIC PORTIONS AND PROGRAMMABLE LOGIC ARCHITECTURE FOR USE THEREWITH

CROSS REFERENCE TO RELATED APPLICATION

This is a division of commonly-assigned U.S. patent application Ser. No. 10/649,401, filed Aug. 26, 2003, now U.S. Pat. No. 6,983,442, which claims the benefit of commonly-assigned U.S. Provisional Patent Application No. 60/405,735, filed Aug. 26, 2002.

BACKGROUND OF THE INVENTION

This invention relates to the provision of both fixed logic portions and programmable logic portions on the same integrated circuit device. More particularly, this invention relates to a method for constructing an integrated circuit device having both fixed logic portions and programmable logic portions, as well as to a programmable logic architecture that is particularly adapted for use with such a method.

Programmable logic devices (PLDs) are well known. Early programmable logic devices were one-time configurable. For example, configuration may have been achieved by "blowing"—i.e., opening—fusible links. Alternatively, the configurations may have been stored in a programmable read-only memory. These devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up table-type logic operations. At some point, such devices began to be provided with embedded blocks of random access memory that could be configured by the user to act as random access memory, read-only memory, or logic (such as P-TERM logic).

PLDs allow a user to programmably create—e.g., using a personal computer with suitable software and a peripheral hardware device into which a PLD chip can be inserted—an integrated circuit device having any desired logic arrangement (within the limits of the PLD itself). In order to provide flexibility in logic design, traditional PLDs typically have a substantially rectilinear arrangement of programmable logic areas arranged generally in rows and columns. Interconnect resources are also provided, frequently including a substantially rectilinear arrangement of conductors aligned generally horizontally and vertically between the rows and columns of programmable logic areas. Connections among these conductors, and between the conductors and the programmable logic areas, are typically programmable, and sufficient conductors are provided, along with sufficient connections among them, and between them and the programmable logic areas, so that by programming those connections a signal can be conducted from any programmable logic area to or from any other programmable logic area or input/output area, as desired in order to implement a particular logic design.

Because of cost and speed penalties associated with early PLDs, those early PLDs typically were used to prove a logic design before committing it to silicon as a custom integrated circuit device for large-scale production. However, as costs decreased and speeds increased, PLDs began to be used in final products in place of custom integrated circuits. In some applications, however, it is desirable to have a single integrated circuit device that is partially fixed logic and partially programmable logic.

For example, a manufacturer of cellular telephones may provide different variants of a certain model of cellular telephone for use with different transmission standards (e.g., TDMA and CDMA). Those different variants of the same model of telephone will have certain logic that is common among the variants, and certain logic that differs from one variant to the other. One solution is to provide, in all variants of that model of telephone, an integrated circuit device having a fixed logic portion and one or more programmable logic portions that can be programmed to provide those logic portions that differ among the variants.

In order to produce such a hybrid integrated circuit device, custom logic is designed and laid out, and then a design for a programmable logic portion is produced or obtained and laid out in one or more available locations on the integrated circuit device. One drawback to this approach is that once the hybrid device has been designed, the programmable logic portion or portions are fixed in size, number and location on the device. This may require a user to use a device having more programmable logic than necessary to implement a certain design, or may require more than one variant of the device—e.g., containing different numbers of programmable logic regions—to be designed and maintained in inventory.

It would be desirable to be able to streamline the process of creating such hybrid integrated circuit devices so that it is not necessary to use a device having more programmable logic than necessary, or to maintain large inventories of different devices.

SUMMARY OF THE INVENTION

The present invention provides the advantage of being able to streamline the process of creating such hybrid integrated circuit devices so that it is not necessary to use a device having more programmable logic than necessary, or to maintain large inventories of different devices. In accordance with the present invention, rather than trying to fit a block of programmable logic of predetermined size onto a device along with fixed logic for performing a fixed set of functions, one obtains a hardware description language representation of the programmable logic and merges that representation with a hardware description language representation of the fixed logic to create a unified hardware description language representation of a device having fixed and programmable logic portions.

Because one is working with a hardware description language representation of the programmable logic, rather than with a predetermined programmable logic configuration, one can tailor the resulting programmable logic portion or portions to the requirements of the particular application. First, the size of the resulting programmable logic can be more precisely matched to the programmable logic requirements of the device. Second, if it is intended that the programmable logic, once programmed by an end user, interact with different portions of the fixed logic on the device, the programmable logic can be arranged on the device as more than one portion, each portion being appropriately sized, with the various portions being distributed among the fixed logic so that signal paths can be made as short as possible or practical.

The programmable logic portion or portions of a device made in accordance with the foregoing method can be made in accordance with any known programmable logic architecture. However, known programmable logic architectures may cause certain difficulties when the hardware description language representation of the device is compiled to create a mask or other physical representation of the final device.

Specifically, known programmable logic architectures are, by design, very flexible. For example, outputs of a particular programmable logic element may be programmably connected to routing resources that are also connected to the inputs of that particular programmable logic element. When a device is constructed according to such an architecture in the conventional way, that is not a problem. The designer uses whatever automated or manual design tools normally are used to lay out the desired circuitry. When that design is then programmed by an end user, the programming software allows only legal configurations.

For example, the programming software ordinarily does not allow a combinational loop to be formed. As an example, a designer would not likely connect the output of a logic block to the input of the same logic block, unless a register inside the logic block were used in the path. However, the hardware description language representation of unprogrammed programmable logic describes the behavior of the unprogrammed circuit, not the programmed circuit. A hardware description language compiler that "sees" a circuit arrangement that allows combinational loops might consider that an error and fail to compile the programmable logic design, even though there is virtually no risk that any user would ever program the device that way, particularly because it is unlikely that the programming software that would be provided would allow such a configuration to be programmed.

Therefore, in accordance with another aspect of the invention, a new programmable logic architecture is provided that is particularly adapted for use with the foregoing method. For example, the architecture preferably does not provide the possibility of combinational loops of the type described above.

In the new architecture, programmable logic elements preferably are arranged in tiers from an input end to an output end. Signals from one tier preferably can flow only in one direction, to the next tier, closer to the output. There preferably is no flexibility to route signals backward towards a previous tier. Although the locations of programmable logic elements in the architecture according to the invention may be thought of as having a one-to-one correspondence to the grid points of a two-dimensional array—i.e., as being arranged in rows and columns—the actual arrangement may be less regular, with programmable logic elements being located wherever on the device there is room for them to be efficiently located, provided that considerations of signal skew are adequately taken into account in the design.

However, for ease of description, and without limiting the present invention, the tiers of programmable logic elements may be thought of as columns in the aforementioned two-dimensional array, in which case each programmable logic element can also be thought of as falling into a row of that array. In the description that follows, the programmable logic elements may be described as though they are arranged in columns (tiers) and rows. No limitation of the invention is intended by such description, except as otherwise noted.

In one preferred embodiment, the number of programmable logic elements in each tier may be the same, in which case the programmable logic architecture may be thought of as rectangular. In such an embodiment, if the number of tiers is the same as the number of programmable logic elements in each tier—i.e., the number of rows—then the rectangular programmable logic architecture may be thought of as square. In another preferred embodiment, the programmable logic architecture may be thought of as trapezoidal, with the number of programmable logic elements decreasing from tier to tier, or even triangular if in the last tier there is only one programmable logic element. In still other embodiments, the number of programmable logic elements may increase from tier to tier, or it may increase and then decrease in a "diamond-shaped" architecture.

In terms of interconnection resources, each tier preferably has associated with it a "per-tier" conductor channel, preferably including multiple conductors, preferably extending along each tier, along the "columns" of the architecture. In addition, there are preferably "trans-tier" conductor channels, also preferably having multiple conductors, preferably extending from the first, or input, per-tier conductor channel and intersecting and extending across the other per-tier conductor channels. In a row-and-column array embodiment, the trans-tier conductor channels preferably extend along or substantially parallel to the rows of the array, so that the trans-tier conductor channels are substantially perpendicular to the per-tier conductor channels. Each particular programmable logic element preferably communicates with two trans-tier conductor channels. In a row-and-column array embodiment, those two trans-tier conductor channels preferably are the ones above and below the row of programmable logic elements in which the particular programmable logic element is situated.

The first per-tier conductor channel—i.e., the per-tier conductor channel associated with the first tier of programmable logic elements—is the input channel. Signals from outside the programmable logic preferably are applied to the conductors of the input channel and are available to the programmable logic elements in the first tier. For each subsequent per-tier conductor channel, each conductor in such a channel preferably is connected to the output of only one programmable logic element in the previous tier, making those outputs available as inputs to the programmable logic elements of the tier associated with that per-tier conductor channel.

Each trans-tier conductor channel preferably starts at the input channel. The number of conductors in each trans-tier conductor channel at the input channel preferably is at most equal to the number of conductors in the input channel. Preferably, programmable interconnect resources, such as multiplexers, allow selective connection of conductors in the input channel to conductors in each trans-tier conductor channel. At its intersection with each subsequent per-tier conductor channel, each trans-tier conductor channel preferably gains one additional conductor, which is selectively connectable to the conductors of the per-tier conductor channel which the trans-tier conductor channel intersects. Thus, each trans-tier conductor channel preferably becomes progressively wider as it progresses from the input end of the programmable logic toward the output end.

Each programmable logic element in the first tier has available to it as inputs the conductors of the input channel. Each programmable logic element in a subsequent tier preferably has available to it as inputs the conductors of the corresponding per-tier conductor channel (representing the outputs of the programmable logic elements of the previous tier), as well as, preferably, conductors of two trans-tier conductor channels. Most preferably, the two trans-tier conductor channels are those adjacent to the programmable logic element in question. In a row-and-column array embodiment, the two trans-tier conductor channels preferably are those above and below the row in which the programmable logic element in question is located.

It will be appreciated that because a given programmable logic element has available to it as inputs only the conductors of its respective per-tier conductor channel (which are connected to outputs of the previous tier) and conductors of trans-tier conductor channels (which are connected to the input channel or to previous, but not subsequent, per-tier conductor channels), each programmable logic element receives as inputs only signals input from outside the programmable logic or signals output by programmable logic elements in previous tiers. There normally is no routing that would allow a programmable logic element to receive as an input the output of a programmable logic element in a subsequent tier. The flow of signals in this architecture normally is from the input end toward the output end. Therefore, normally there is no possibility of a combinational loop, and therefore the architecture is particularly well-suited to the aforementioned method.

This programmable logic architecture preferably has a plurality of outputs. Each output preferably is selected from among (a) any output of a respective programmable logic element whose output is not connected to a conductor in one of the per-tier conductor channels, and (b) a subset of the conductors in two of the trans-tier conductor channels.

In a row-and-column array type architecture, this means that the outputs are the outputs of those programmable logic elements in the last column—or those closest to the ends of their respective rows in a trapezoidal, triangular or diamond-shaped array as discussed above, along with a subset of the conductors of two trans-tier conductor channels. An output multiplexer or similar device selects each output from among (a) the output of the last programmable logic element in a particular row, and (b) a subset of the conductors in the two trans-tier conductor channels above and below that row. Preferably, however, an output channel may be provided to which the output of the last programmable element in each row is connected and in that case each of the output multiplexers may select from any of the outputs in the output channel, so that the trans-tier conductor channels from among which the multiplexer also selects may not be the trans-tier conductor channels with which the programmable logic element, whose output that multiplexer selects, communicates. However, even in such a case, the two trans-tier conductor channels from among which the multiplexer selects preferably are adjacent to the multiplexer and therefore to one another.

Therefore, in accordance with the present invention, there is provided a method of creating an integrated circuit device for performing a set of functions. The method includes partitioning the set of functions into (a) a first group of functions to be performed by fixed logic, and (b) a second group of functions to be performed by programmable logic. A hardware description language representation of fixed logic for performing the first group of functions, and a hardware description language representation of the programmable logic are obtained and merged to create a unified hardware description language representation of the integrated circuit device.

A particular architecture for use with the method has an input end, an output end, and a plurality of tiers of programmable logic elements arranged successively from the input end to the output end. Each of the tiers includes a respective particular number of the programmable logic elements. A plurality of per-tier conductor channels corresponds in number to the plurality of tiers. Each per-tier conductor channel is associated with a particular tier. One of the per-tier conductor channels is closest to the input end and is an input channel. The conductors in the input channel are inputs of the programmable logic architecture. Each particular per-tier conductor channel, other than the input channel, includes a number of conductors equal to the particular number of programmable logic elements in the tier immediately preceding the particular tier with which the particular per-tier conductor channel is associated, and each conductor in the particular per-tier conductor channel is connected to an output of only one programmable logic element in the tier immediately preceding the particular tier with which the particular per-tier conductor channel is associated. A plurality of trans-tier conductor channels extends from the input end to the output end intersecting the per-tier conductor channels. Each of the trans-tier conductor channels has a predetermined number of conductors at the input channel, and gains one additional conductor substantially at its respective intersection with each of the per-tier conductor channels. Each programmable logic element communicates with two of the trans-tier conductor channels. Inputs of each individual programmable logic element in that one of the tiers at the input end are selected from among conductors in the input channel, and inputs of each individual programmable logic element in tiers other than that one of the tiers at the input end are selected from among (a) conductors in the per-tier conductor channel with which the tier in which the individual programmable logic element is located is associated, and (b) conductors in both trans-tier conductor channels with which the individual programmable logic element communicates. Each respective output of the programmable logic architecture is selected from among (a) an output of a respective one of the programmable logic elements other than any of those of the programmable logic elements whose outputs are connected to respective ones of the conductors in the per-tier conductor channels, and (b) a subset of conductors in each of two of the trans-tier conductor channels.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, the present invention allows a logic device having fixed logic portions and programmable logic portions to be designed more flexibly. By using hardware description language tools to create the programmable logic portion of the device as well as the fixed logic portion, a user of the method of the invention is freed from the constraints of the standardized portion of programmable logic previously available for incorporation into a combined fixed/programmable logic device.

Figure 1:
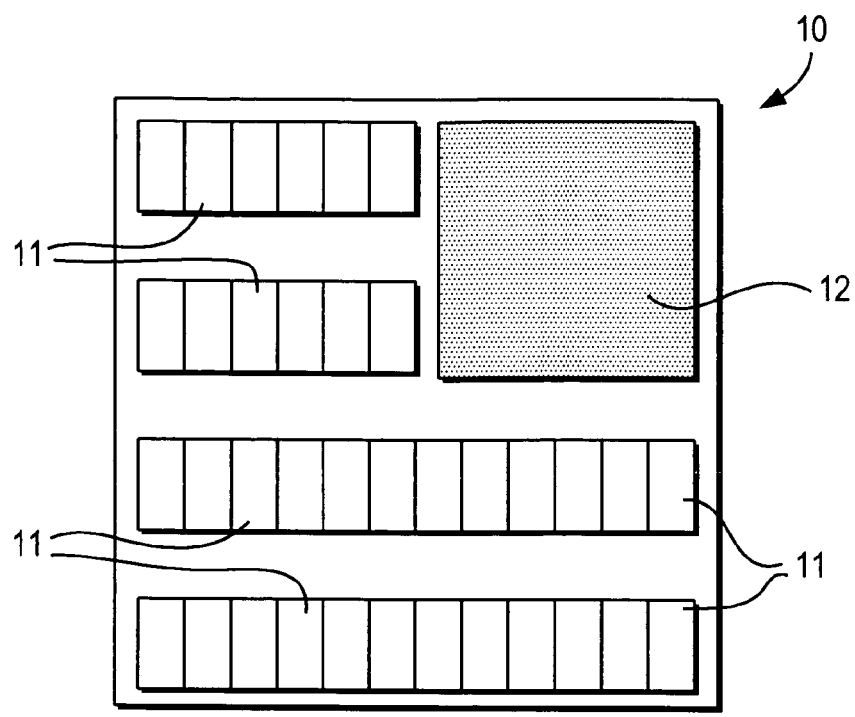
FIG. 1 is a schematic diagram of a logic device having both a fixed logic portion and a programmable logic portion.

For example, a previously known combined fixed/programmable logic device 10 is shown in FIG. 1. Logic device 10 includes areas of fixed logic 11 and single relatively large area of programmable logic 12. Programmable logic 12 may be obtained—e.g., in mask form—from a vendor of PLDs. The designer of logic device 10 is limited to portions 12 of programmable logic that are available from such vendors. Therefore, that designer might have to accept a design having fewer, larger portions of programmable logic than might be optimum for the overall design of device 10.

Figure 2:
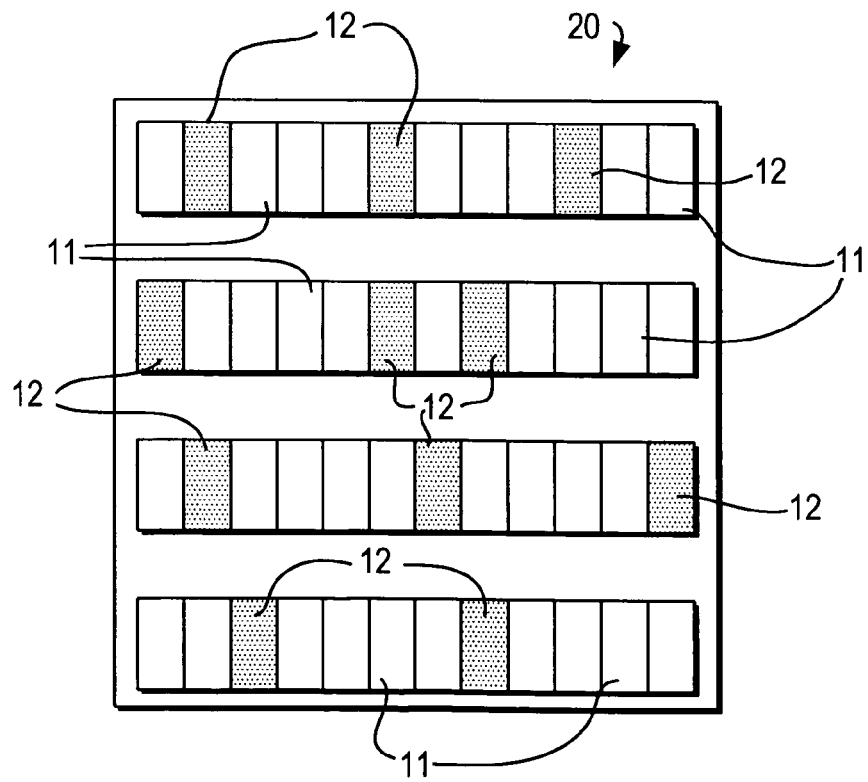
FIG. 2 is a schematic diagram of a logic device having programmable logic portions distributed among fixed logic portions.

By comparison, FIG. 2 shows a combined fixed/programmable logic device 20 having portions of fixed logic 11 and smaller, more widely distributed portions 21 of programmable logic. Such an arrangement might be more desirable than that shown in FIG. 1 because of reduced skew resulting from the shorter paths that signals are required to take to reach the programmable logic areas from the fixed logic areas. However, heretofore the ability to design a logic device 20 has been limited by whether or not a vendor would provide sufficiently small programmable logic portions 21.

Figure 3:
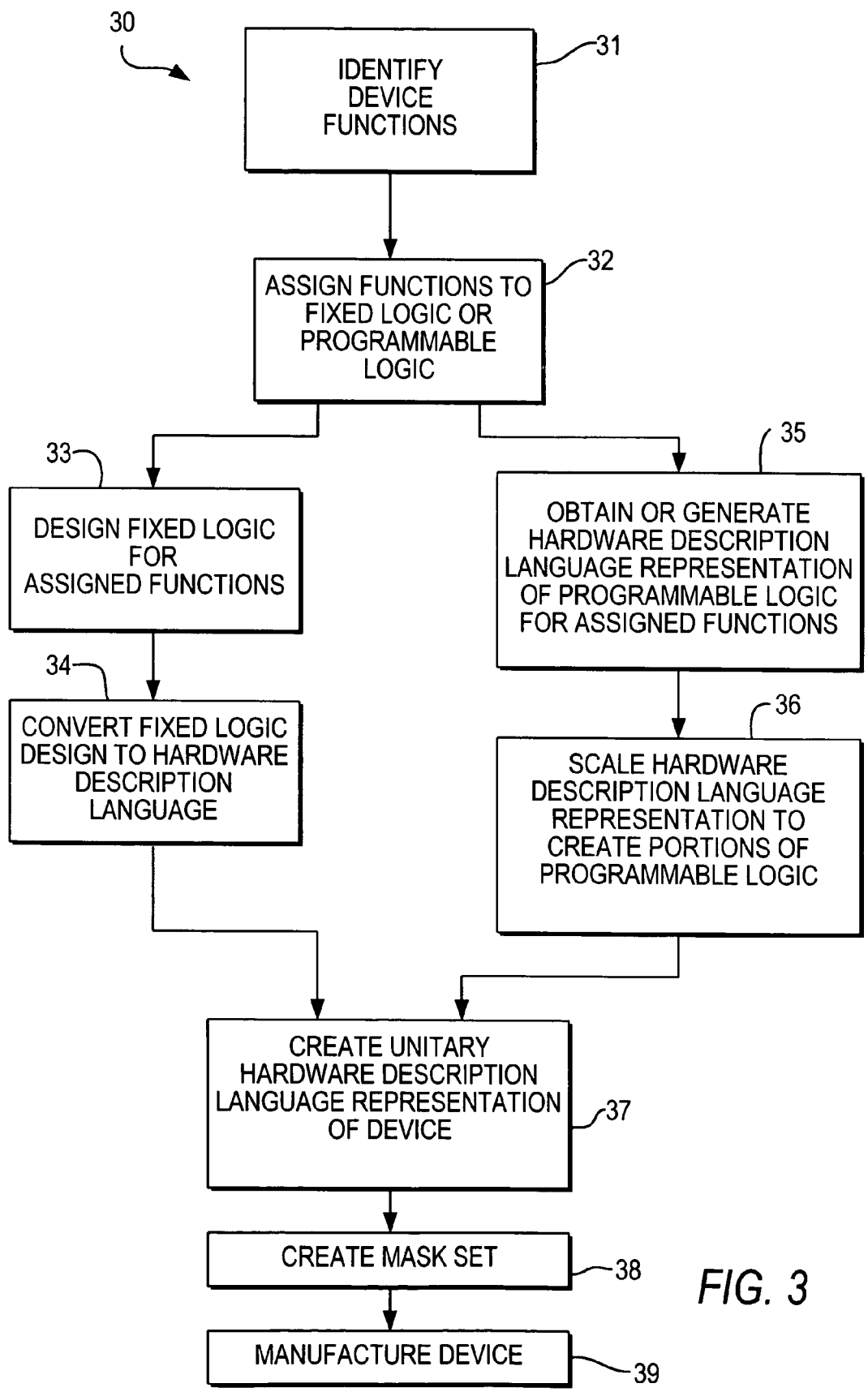
FIG. 3 is a flowchart of a preferred embodiment of a method according to the present invention for creating logic devices as in FIGS. 1 and 2.

Method 30 diagrammed in FIG. 3 allows the design and production of a logic device such as device 20 having distributed small areas of programmable logic 21. According to method 30, the designer of device 20 decades at step 31 what functions are to be performed by device 20 and at step 32 partitions those functions into a first group of functions to be performed by fixed logic 11, and a second group of functions to be performed by programmable logic 21. As discussed above in the cellular telephone example, the first group of functions might be those functions of a cellular telephone that are independent of the transmission standard used by the telephone, while the second group of functions might be the standard-dependent features of the telephone.

At step 33, the designer designs fixed logic to perform the first group of functions. This design can be carried out by hand, but preferably is carried out using automated design tools as are normally used for such purposes. Either way, at step 34 the design is converted to a hardware description language, such as VHDL or Verilog, which can be used to instruct automated tools to make device 20.

In parallel with steps 33 and 34, the designer preferably designs at step 35 programmable logic 21 to perform those functions that should be performed in programmable logic. In this case, the designer is not designing the logic for those functions, but rather programmable logic that can be programmed to perform those functions. Although the designer could do this independently, more likely the designer will obtain, from a supplier of programmable logic, the hardware description language representation of programmable logic suitable for the intended functions. Using appropriate tools at step 36, the designer can scale the hardware description language representation of programmable logic 21 to create as many portions of whatever size of programmable logic regions 21 as are desired.

Next, at step 37, using suitable software tools, the designer preferably combines the hardware description language representations of fixed logic portion 11 and programmable logic portions 21 into a unitary hardware description language representation of device 20. The unitary hardware description language representation can be stored for later use, or even provided to others for their use. However, at step 38 the unified hardware description language representation of device 20 preferably is converted into a physical representation of device 20, such as a set of one or more masks. At step 39, those masks preferably are used to make device 20 in the conventional manner.

It should be noted that while method 30 allows the construction of devices like device 20, it also allows the construction of devices like device 10. The advantage of method 30 is its flexibility. Rather than obtaining from the supplier of programmable logic a particular piece of programmable logic circuitry (either the actual circuitry or masks for producing it), a practitioner of method 30 obtains the hardware description language representation of the behavior of the programmable logic circuitry. This allows the practitioner of method 30 to create as few or as many portions of programmable logic circuitry as desired in sizes as small or as large as desired. The practitioner of method 30 is not limited to any particular physical product of the supplier of programmable logic.

The method according to the invention may be used with any programmable logic device architecture. However, because one is working with a hardware description language representation of the behavior of the programmable logic (as opposed to a representation of the programmed programmable logic as is normally the case with conventional programmable logic programming software), the software may recognize potential illegal connections (such as the aforementioned combinational loops) and generate errors during the compiling of the design. While it may be possible to suppress or override those errors, the operator may become so conditioned to suppressing or overriding errors that he or she may suppress or override a true error. In any case, requiring frequent operator intervention negates some of the advantages of automated processes and is not desirable. Therefore, in accordance with another aspect of the present invention, a programmable logic architecture is provided that is particularly well-suited for use in the method of the invention, although it may be used without the method as well.

Figure 4:
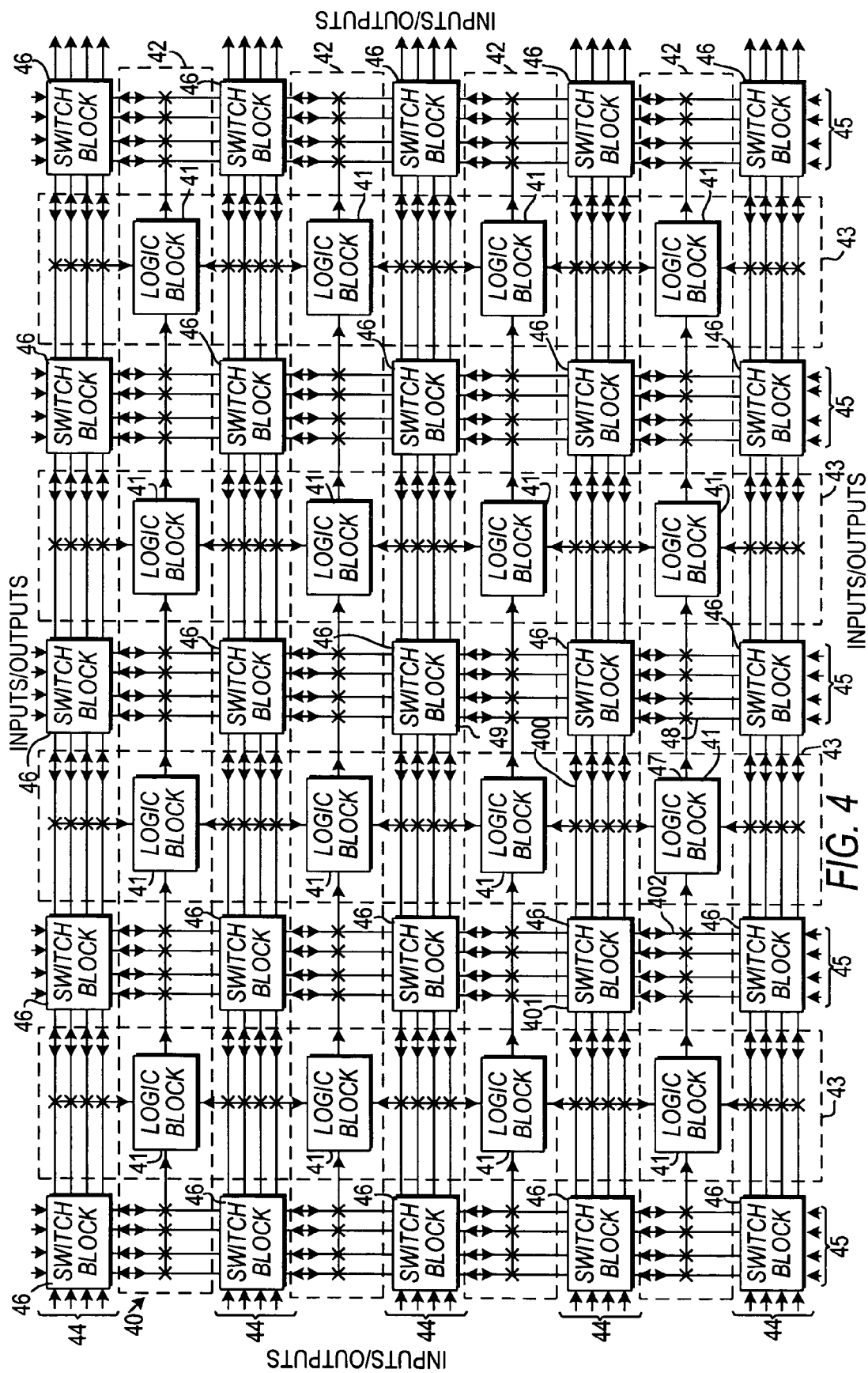
FIG. 4 is a schematic diagram of a previously known programmable logic device architecture illustrating a potential unsuitability for use with the method of FIG. 3.

For comparison, a simplified generic conventional programmable logic architecture 40 is shown in FIG. 4. Architecture 40 includes a rectangular array of programmable logic elements or blocks 41 arranged substantially in rows 42 and columns 43. Logic blocks 41 have access to horizontal and vertical conductor channels 44, 45 which run between rows 42 or columns 43, respectively. In this particular embodiment, at every intersection of a horizontal conductor channel 44 with a vertical conductor channel 45, a switch block 46 is provided allowing signals to be switched from one conductor channel to another. Each switch block 46 may contain a fully or partially populated switch matrix (not shown). In any event, it is clear from FIG. 4 that, although an end-user would be unlikely to program the programmable logic to do so, it would be possible to route the output of, e.g., some logic in logic block 47, via conductor 48, switch block 49, conductor 400, switch block 401 and conductor 402 back to the same logic in logic block 47, without a register in the path which could be an illegal combinational loop. When the software tool attempts to compile the hardware description language representation of architecture 40, it may recognize this and similar possibilities and declare them to be errors. As discussed above, at the very least this may require operator intervention to override the error.

Figure 5:
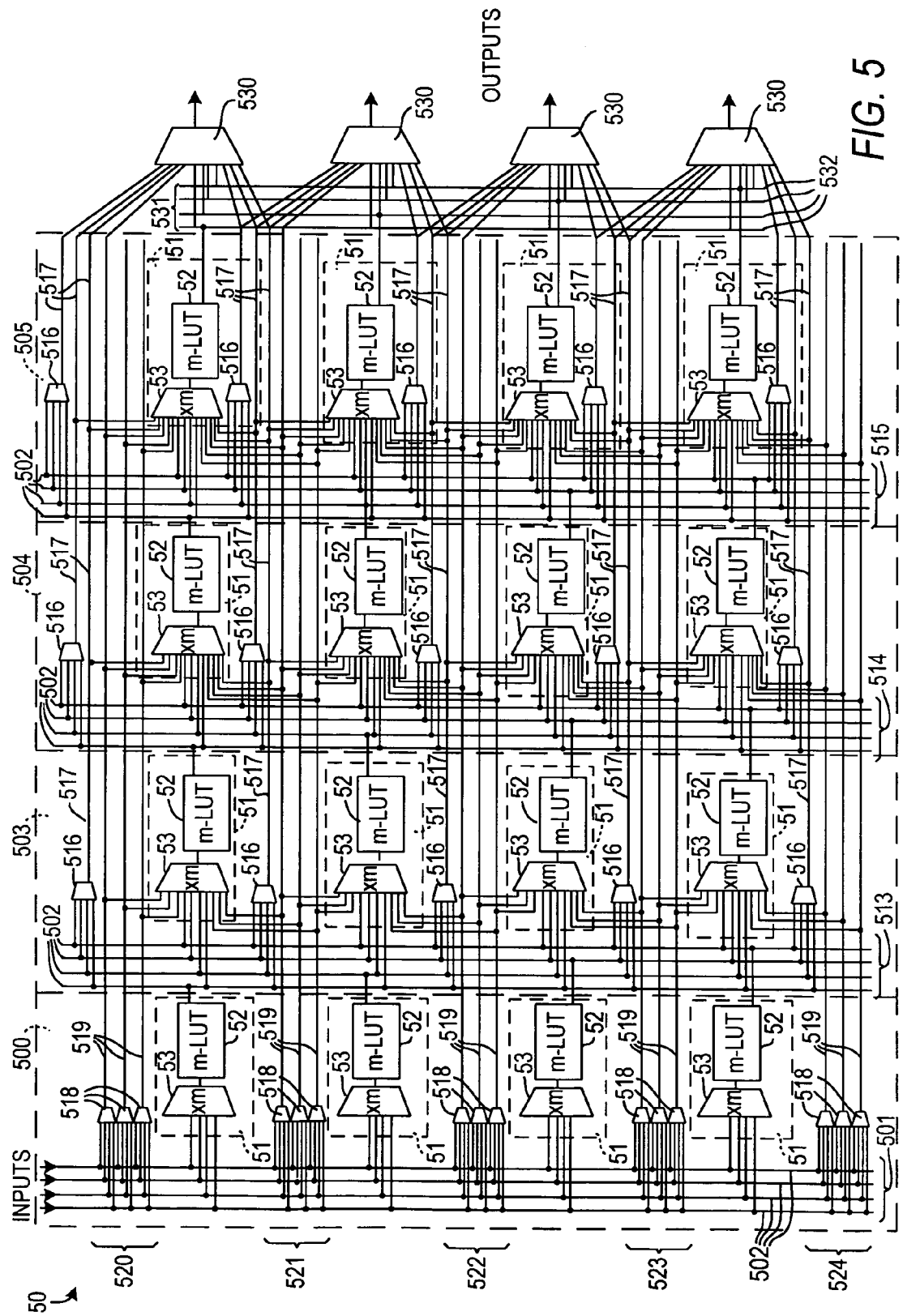
FIG. 5 is a schematic diagram of a first preferred embodiment of programmable logic device architecture in accordance with the present invention.
Figure 6:
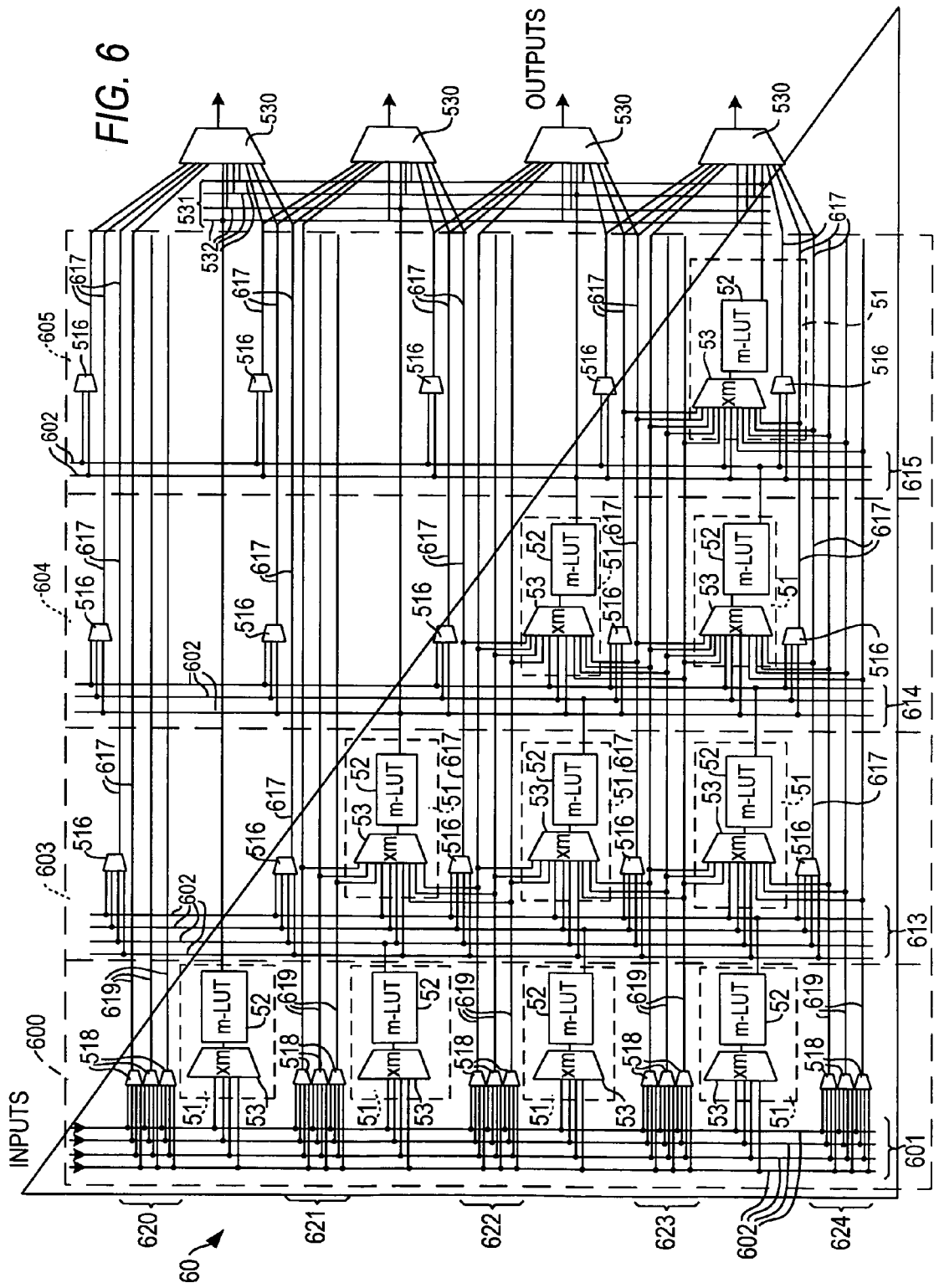
FIG. 6 is a schematic diagram of a second preferred embodiment of programmable logic device architecture in accordance with the present invention.

FIGS. 5 and 6 show embodiments 50 and 60 of a programmable logic architecture in accordance with the present invention that may be used with the method of the present invention with less risk of compiler error, because there is less risk of supporting potential illegal connections in the programmable logic.

In both embodiments 50, 60, the basic logic block or element 51 preferably is an m-input lookup table 52 connected to n inputs by an n-to-m multiplexer 53. The sources of the n inputs will be discussed below.

In architecture 50, programmable logic elements (LEs) 51 preferably are arranged in a rectangular distribution in which the location of each LE 51 corresponds to a grid point in a two-dimensional array. The LEs 51 may thus be thought of as occupying rows and columns of an array. However, it is not necessary for the distribution to be rectangular. As shown in FIG. 6, for example, architecture 60 is a "triangular" distribution of LEs 51, based on the observation that for many logic problems or functions, the number of inputs may be large while the number of outputs is small, or even one, so that more LEs 51 are needed at the input end while fewer are needed at the output end. "Triangular" architecture 60 has one LE 51 in the last column; however, this requires that the number of rows equal the number of columns. If the number of rows exceeds the number of columns, an architecture similar to architecture 60, in which the number of LEs 51 per column decreases monotonically, but does not reach one, might be referred to as "trapezoidal." It may even be possible to have a "diamond-shaped" architecture (not shown) in which the number of LEs 51 per column first increases and then decreases. It also may be possible to have an architecture in which the number of LEs 51 per column is constant over a number of columns, then decreases and remains constant for a further number of columns, etc. (not shown), or even an architecture in which the number of LEs 51 per column varies irregularly (not shown), so that there is no regular geometric figure to which the architecture corresponds.

Moreover, although in the architectures shown in FIGS. 5 and 6 and the other architectures described but not shown above, the LEs 51 are located on the grid points of a two-dimensional array, even (as in the triangular case) where not all of the grid points are occupied, the present invention does not require such a row-and-column arrangement. As long as the LEs 51 are arranged in tiers, as described above, that are associated with conductor channels in the manner described, the tiers need not be arranged in straight lines, nor do the LEs 51 in "adjacent" tiers (they also need not actually be physically near one another) need to be aligned in rows. As long as the actual arrangement does not introduce excessive signal skew, any arrangement of LEs 51 within a tier, and any relationship of one tier to another, can be used. However, for ease of description, the discussion below will refer to row-and-column arrangements unless otherwise indicated.

As seen in FIG. 5, the first tier or column 500 on the left-hand or input end of architecture 50 has associated with it per-tier conductor channel 501 including conductors 502.

For this first tier 500, which is the input tier, channel 501 may be referred to as the input channel, insofar as conductors 502 of channel 501 are used to receive external inputs to the logic of architecture 50. The number of conductors in channel 501 is therefore a function of the number of inputs to be made available to users.

Each subsequent tier 503, 504, 505 has associated with it a respective per-tier conductor channel 513, 514, 515. The number of conductors in each of channels 513, 514, 515 preferably is equal to the number of LEs 51 in the tier preceding the tier with which the channel in question is associated. Because in rectangular architecture 50 the number of LEs 51 in each tier is the same (four LEs 51 per tier), the number of conductors in each channel 513, 514, 515 preferably is the same (four conductors per channel). On the other hand, in triangular architecture 60 the number of LEs decreases from one tier 600, 603, 604, 605 to the next, and therefore so does the number of conductors 602 in each per-tier conductor channel 601, 613, 614, 615. In a diamond-shaped or irregular architecture as described above, the number of conductors in the per-tier conductor channels would vary.

Each conductor preferably is connected to the output of only one of the LEs 51 in the preceding tier. Thus, each conductor in one of per-tier conductor channels 513, 514, 515 is used to make available, to the LEs 51 in the tier (503, 504, 505) with which that per-tier conductor channel is associated, the output of one LE 51 of the previous tier. Each LE 51 in the previous tier provides its output to one conductor in the per-tier conductor channel of the current tier. All LEs 51 in the current tier preferably have access to all conductors in the current per-tier conductor channel, and therefore to the outputs of all LEs 51 in the preceding tier. However, an arrangement (not shown) could be provided in which each LE 51 in the current tier has access to only a subset of the conductors in the current per-tier conductor channel, and therefore to the outputs of only a subset of the LEs 51 in the preceding tier. In such an arrangement, it would be preferable if, for each individual output of LEs 51 of the preceding tier, at least one LE 51 in the current tier would have access that output.

A plurality of trans-tier conductor channels 520-524, 620-624 preferably run from tier to tier, intersecting the per-tier conductor channels. Preferably, the number of trans-tier conductor channels exceeds by one the number of LEs 51 in the input tier 500, 600, with each LE 51 having access to two trans-tier conductor channels. In a row-and-column arrangement as in FIG. 5 or 6, the trans-tier conductor channels preferably run parallel to the rows of LEs 51, with each row of LEs 51 running between two trans-tier conductor channels. In particular, in a row-and-column arrangement, the two trans-tier conductor channels to which a particular LE 51 has access preferably are the two trans-tier conductor channels between which runs the row of which that LE 51 is a member.

Each trans-tier conductor channel preferably begins at input channel 501, 601, and, at its intersection with input channel 501, 601, preferably has at most as many conductors 519, 619 as are present in input channel 501, 601. The conductors 519, 619 of each trans-tier conductor channel preferably are switchably connected to the conductors 502, 602 of the input channel 501, 601, particularly where the trans-tier conductor channel has fewer conductors than the input channel, so that each input signal can, if desired, be switched onto the trans-tier conductor channel. If the number of conductors 519, 619 in the trans-tier conductor channel at its intersection with input channel 501, 601 is equal to the number of conductors 502, 602 in input channel 501, 601, then the connections between conductors 502, 602 and conductors 519, 619 can be fixed if desired, although even in such a configuration those connections may be switchable. In the embodiment shown, multiplexers 518 preferably are provided to switchably connect conductors 502, 602 of input channel 501, 601 to conductors 519, 619 of each trans-tier conductor channel 520-524, 620-624. Other types of switching elements can be provided.

Each trans-tier conductor channel preferably gains an additional conductor 51, 6177 each time it intersects a per-tier conductor channel. Again, a multiplexer 516 (or other switching element) preferably is provided at each intersection to select which one of conductors 502, 602 of the per-tier conductor channel will be connected to the added conductor 517, 617 of the trans-tier conductor channel at that intersection.

Each LE 51 preferably includes an m-input lookup table (LUT) 510 receiving its inputs from an n-to-m multiplexer 511. The number of inputs m to each LUT 510 preferably is (but need not be) the same for all LEs 51 in a single device, and may be, e.g., three or four. The number of inputs n to each multiplexer 511 preferably is different for each tier, because n preferably is the sum of the number of conductors 502, 602 in the corresponding per-tier conductor channel and the number of conductors 519, 517 or 619, 617 in the two trans-tier conductor channels with which each LE 51 communicates (the two adjacent trans-tier conductors in the embodiments shown in FIGS. 5 and 6). Note that the number of inputs n need not (and preferably does not) include the conductor newly-added to the trans-tier conductor at each intersection with a per-tier conductor channel, because the signal on that conductor will be available to LE 51 on one of conductors 502, 602 of that per-tier conductor channel.

Thus, in the rectangular embodiment 50 of FIG. 5, where each tier includes four LEs 51, the contribution to n by the per-tier conductors 502 in each tier is four, but n grows by two in each successive tier, because each trans-tier conductor channel gains one conductor. On the other hand, in the triangular embodiment 60 of FIG. 6, where the number of LEs 51 decreases by one in each tier, the contribution to n by the per-tier conductors 602 decreases by one in each tier, but the contribution to n by the trans-tier conductors still grows by two in each successive tier, for a net gain of one additional input in each successive tier. In other embodiments, where the number of LEs 51 per tier varies differently, n will change accordingly.

Logically, the output of any LE 51 may be an output of a device built using the architecture of the invention. However, in terms of physical connections to output pins, outputs preferably are selected from among any output of an LE 51 that is not connected to a per-tier conductor 502, 602. In a row-and-column arrangement, that refers to any LE 51 at the end of a row. In rectangular embodiment 50 those are the LEs 51 in the last column or tier. In triangular embodiment 60, or any other non-rectangular row-and-column embodiment, those LEs are not in any single column or tier, but nevertheless each is the last LE 51 in its respective row. Outputs preferably also are selected from among a subset of the conductors in each trans-tier conductor channel. In embodiments 50, 60, that subset preferably includes all of the "additional" conductors 517, 617 in each trans-tier conductor channel, because those conductors carry output signals from LEs 51 that are not at the ends of their respective rows, but a user may desire to use one of them as a device output. That subset also preferably includes some (one, in the embodiments shown) of the trans-tier conductors 519, 619 that connect to the conductors in input channel 501, 601, in case a user wants to pass an input through as an output.

In embodiments 50, 60, the outputs preferably are selected by output multiplexers 530. Each output multiplexer 530 preferably selects the aforementioned subset of conductors from two trans-tier conductor channels. As shown, the two trans-tier conductor channels from which each output multiplexer 530 selects preferably are two adjacent trans-tier conductor channels, meaning, in a row-and-column embodiment, the two trans-tier conductor channels parallel to a single row of LEs 51. However, it is also possible for an output multiplexer 530 to select from non-adjacent trans-tier conductor channels (not shown). Each output multiplexer 530 also selects from among the aforementioned outputs of LEs 51 that are not connected to per-tier conductor channels. In one embodiment (not shown), each output multiplexer 530 selects from only one of LEs 51, as well as from the two trans-tier conductor channels adjacent that one of LEs 51. However, in embodiments 50, 60 as shown, while each output multiplexer 530 selects from among the conductors of two trans-tier conductor channels adjacent one another, each output multiplexers 530 is not limited to selecting from an LE 51 adjacent those two adjacent trans-tier conductor channels. Rather, an output channel 531 is provided, including conductors 532, with the output of each LE 51 that is not connected to a per-tier conductor channel being connected to one of conductors 532. Each output multiplexer 530 can select any of conductors 532 and therefore any LE 51 whose output is not connected to a per-tier conductor channel (i.e., that is at the end of a row in a row-and-column embodiment).

It will be noted that because the output of each LE 51 in the architecture according to the invention is connected only to a conductor in a per-tier conductor channel that serves a subsequent tier of LEs, or to a conductor in a trans-tier conductor channel which conductor serves only subsequent tiers of LEs, no LE output in this architecture can feed back to the LE that generated the output (unless an external connection is made by a user). Therefore, combinational loops cannot be constructed using the architecture according to this invention, meaning that the hardware description language representation of the architecture will compile without generating errors. That makes this architecture particularly well suited for use in the aforementioned method.

Figure 7:
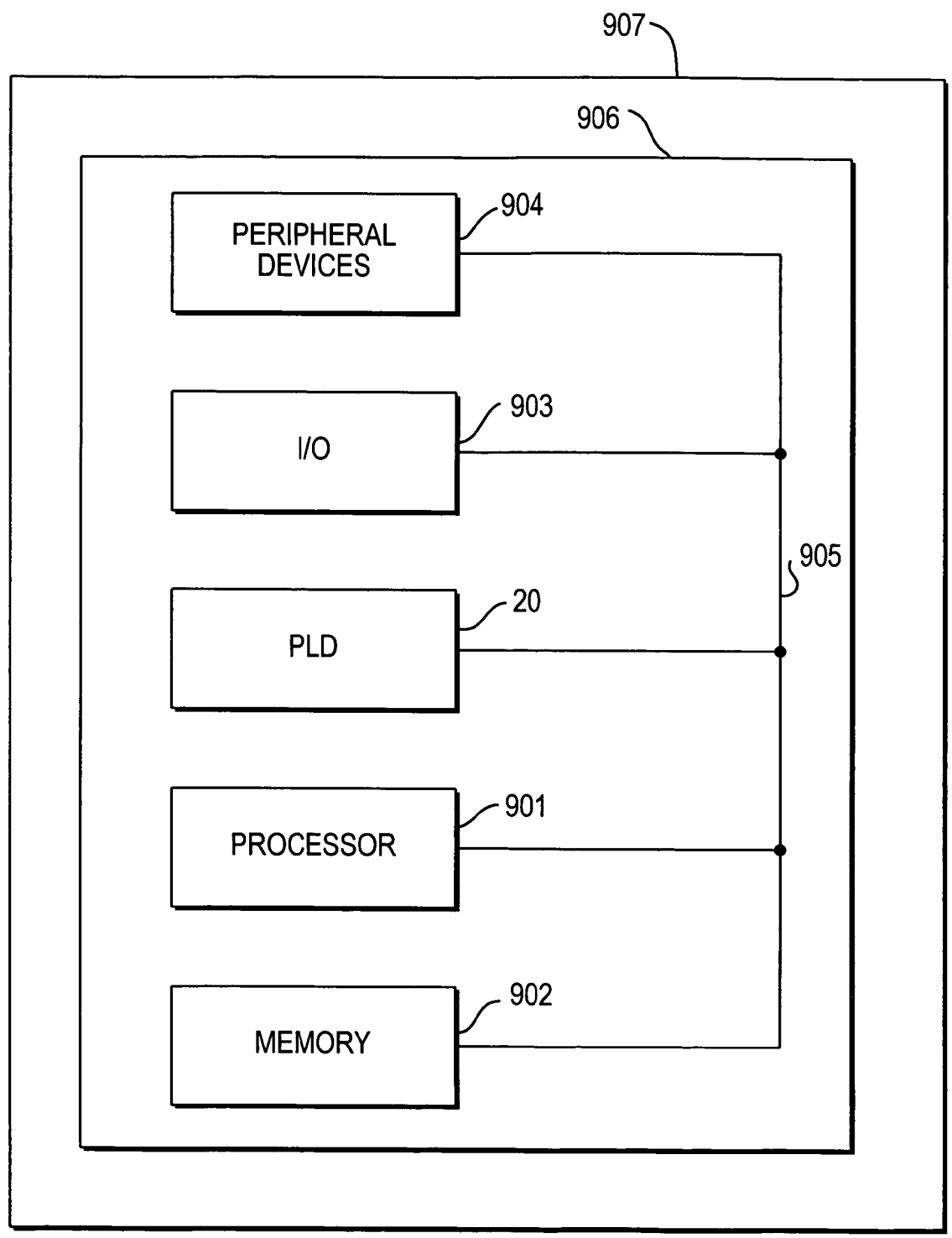
FIG. 7 is a simplified block diagram of an illustrative system incorporating a programmable logic device designed and/or manufactured in accordance with the present invention.

A PLD 20 according to the present invention may be used in many kinds of electronic devices. One possible use is in a data processing system 900 shown in FIG. 7. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 700 can be used to perform a variety of different logic functions. For example, PLD 700 can be configured as a processor or controller that works in cooperation with processor 901. PLD 700 may also be used as an arbiter for arbitrating access to a shared resources in system 900. In yet another example, PLD 700 can be configured as an interface between processor 901 and one of the other components in system 900. It should be noted that system 900 is only exemplary, and that the true scope and spirit of the invention should be indicated by the following claims.

Various technologies can be used to implement PLDs 700 as described above and made according this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method of creating an integrated circuit device for performing a set of functions, said method comprising:
   partitioning said set of functions into (a) a first group of functions to be performed by fixed logic, and (b) a second group of functions to be performed by programmable logic;
   obtaining a hardware description language representation of fixed logic for performing said first group of functions;
   obtaining a hardware description language representation of said programmable logic based on a programmable logic architecture, said programmable logic architecture being optimized for at least one of (a) description by a hardware description language, and (b) fabrication in portions among portions of fixed logic;
   merging said hardware description language representation of said fixed logic for performing said first group of functions and said hardware description language representation of said programmable logic to create a unified hardware description language representation of said integrated circuit device.

2. The method of claim 1 wherein said unified hardware description language representation defines an integrated circuit device in which said programmable logic is distributed in portions among portions of said fixed logic.

3. The method of claim 1 wherein said obtaining said hardware description language representation of said fixed logic for performing said first group of functions comprises:
   designing said first group of functions; and
   generating said hardware description language representation of said fixed logic for performing said first group of functions.

4. The method of claim 3 wherein said obtaining said hardware description language representation of said programmable logic comprises obtaining a preexisting hardware description language representation of said programmable logic.

5. The method of claim 1 wherein said obtaining said hardware description language representation of said fixed logic for performing said first group of functions comprises obtaining a preexisting hardware description language representation of said fixed logic for performing said first group of functions.

6. The method of claim 5 wherein said obtaining said hardware description language representation of said programmable logic comprises obtaining a preexisting hardware description language representation of said programmable logic.

7. The method of claim 1 wherein said obtaining said hardware description language representation of said programmable logic comprises obtaining a preexisting hardware description language representation of said programmable logic.

8. The method of claim 1 further comprising converting said unified hardware description language representation of said integrated circuit device into a physical representation of said integrated circuit device.

9. The method of claim 8 wherein said converting comprises generating a set of at least one mask.

10. The method of claim 8 further comprising fabricating said integrated circuit device from said physical representation.

11. The method of claim 1 wherein said obtaining a hardware description language representation of a programmable logic architecture comprises obtaining a hardware description language representation of a programmable logic architecture comprising:
   an input end;
   an output end;
   a plurality of tiers of programmable logic elements arranged successively from said input end to said output end, each of said tiers comprising a respective particular number of said programmable logic elements;
   a plurality of per-tier conductor channels corresponding in number to said plurality of tiers, wherein:
   each per-tier conductor channel is associated with a particular tier,
   one of said per-tier conductor channels is closest to said input end and is an input channel, said conductors in said input channel being inputs of said programmable logic architecture,
   each particular per-tier conductor channel, other than said input channel, comprises a number of conductors equal to the respective particular number of programmable logic elements in the tier immediately preceding the particular tier with which said particular per-tier conductor channel is associated, and
   each conductor in said particular per-tier conductor channel is connected to an output of only one programmable logic element in said tier immediately preceding the particular tier with which said particular per-tier conductor channel is associated;
   a plurality of trans-tier conductor channels extending from said input end to said output end intersecting said per-tier conductor channels, wherein:
   each said trans-tier conductor channel has a predetermined number of conductors at said input channel,
   each said trans-tier conductor channel gains one additional conductor beginning substantially at its respective intersection with each said per-tier conductor channel,
   each said programmable logic element communicates with two said trans-tier conductor channels,
   inputs of each individual programmable logic element in that one of said tiers at said input end are selected from among conductors in said input channel, and
   inputs of each individual programmable logic element in tiers other than that one of said tiers at said input end are selected from among (a) conductors in said per-tier conductor channel with which said tier in which said individual programmable logic element is located is associated, and (b) conductors in both trans-tier conductor channels with which said individual programmable logic element communicates; and
   each respective output of said programmable logic architecture is selected from among (a) an output of a respective one of said programmable logic elements other than any of those of said programmable logic elements whose outputs are connected to respective ones of said conductors in said per-tier conductor channels, and (b) a subset of conductors in each of two of said trans-tier conductor channels.

* * * * *